United States Patent
Hong et al.

(10) Patent No.: US 12,116,503 B2
(45) Date of Patent: Oct. 15, 2024

(54) POLISHING COMPOSITION FOR SEMICONDUCTOR PROCESS AND METHOD FOR MANUFACTURING SEMICONDUCTOR DEVICE BY USING THE SAME

(71) Applicant: SK enpulse Co., Ltd., Gyeonggi-do (KR)

(72) Inventors: Seung Chul Hong, Seoul (KR); Deok Su Han, Seoul (KR); Jang Kuk Kwon, Seoul (KR); Han Teo Park, Seoul (KR)

(73) Assignee: SK ENPULSE CO., LTD., Gyeonggi-do (KR)

( * ) Notice: Subject to any disclaimer, the term of this patent is extended or adjusted under 35 U.S.C. 154(b) by 249 days.

(21) Appl. No.: 17/734,073

(22) Filed: May 1, 2022

(65) Prior Publication Data
US 2022/0363948 A1 Nov. 17, 2022

(30) Foreign Application Priority Data
Apr. 30, 2021 (KR) .................. 10-2021-0056409

(51) Int. Cl.
*C09G 1/02* (2006.01)
*H01L 21/321* (2006.01)

(52) U.S. Cl.
CPC ............ *C09G 1/02* (2013.01); *H01L 21/3212* (2013.01)

(58) Field of Classification Search
None
See application file for complete search history.

(56) References Cited

U.S. PATENT DOCUMENTS

| 10,626,298 | B1* | 4/2020 | Penta ............... H01L 21/3212 |
| 2004/0209555 | A1 | 10/2004 | Sun et al. |
| 2008/0287038 | A1 | 11/2008 | Miyabe et al. |
| 2009/0081927 | A1* | 3/2009 | Grumbine ............ C09K 3/1436 |
| | | | 451/36 |
| 2015/0376463 | A1 | 12/2015 | Fu et al. |
| 2016/0288289 | A1* | 10/2016 | Suzuki ..................... C09G 1/02 |

(Continued)

FOREIGN PATENT DOCUMENTS

| JP | 2011-216582 A | 10/2011 |
| JP | 2020-025066 A | 2/2020 |

(Continued)

OTHER PUBLICATIONS

Wikipedia "(3-Aminopropyl)triethoxysilane" via https://en.wikipedia.org/wiki/(3-Aminopropyl)triethoxysilane (Year: 2023).*

(Continued)

*Primary Examiner* — Binh X Tran
(74) *Attorney, Agent, or Firm* — IP&T GROUP LLP (57) ABSTRACT

The present disclosure relates to a polishing composition for a semiconductor process that may increase a polishing rate of a boron-doped polysilicon layer, improve polishing selectivity, prevent a defect of a wafer that may occur in a polishing process, and improving surface roughness of the wafer, and a method for polishing a substrate by using the same. In addition, the present disclosure relates to a method for manufacturing a polished substrate by using a polishing composition for a semiconductor process.

19 Claims, 2 Drawing Sheets

(56) References Cited

U.S. PATENT DOCUMENTS

2020/0203172 A1\* 6/2020 Ballesteros .............. C09G 1/02
2020/0303198 A1\* 9/2020 Kadohashi .......... H01L 21/3212
2021/0047541 A1 2/2021 Tseng

FOREIGN PATENT DOCUMENTS

KR 10-2019-0109236 A 9/2019
TW 201723139 A 7/2017
TW 201939596 A 10/2019

OTHER PUBLICATIONS

Extended European Search Report for the European Patent Application No. 22170427.3 issued by the European Patent Office on Oct. 11, 2022.
Office Action for the Japanese Patent Application No. 2022-073393 issued by the Japanese Patent Office on Jun. 27, 2023.
Office Action for the Taiwanese Patent Application No. 111116338 issued by the Taiwanese Patent Office on Dec. 5, 2022.
Office Action for the Chinese Patent Application No. 202210454337.4 issued by the Chinese Patent Office on Sep. 12, 2023.
Office Action for Korean Patent Application No. 10-2021-0056409 issued by the Korean Patent Office on Apr. 21, 2023.

\* cited by examiner

POLISHING COMPOSITION FOR SEMICONDUCTOR PROCESS AND METHOD FOR MANUFACTURING SEMICONDUCTOR DEVICE BY USING THE SAME

CROSS-REFERENCE TO RELATED APPLICATION(S)

This application claims benefit of priority to Korean Patent Application No. 10-2021-0056409 filed on Apr. 30, 2021 in the Korean Intellectual Property Office, the disclosure of which is incorporated herein by reference in its entirety.

TECHNICAL FIELD

The present disclosure relates to a polishing composition for a semiconductor process and a method for manufacturing a semiconductor device by using the same.

BACKGROUND ART

As a semiconductor device becomes finer and denser, a technique for forming finer patterns has been used, and accordingly, surface structures of semiconductor devices have become more complicated, and steps of interlayer films have also increased. In manufacturing the semiconductor device, a chemical mechanical polishing (CMP) process is used as a planarization technology for removing a step in a specific layer formed on a substrate.

In the CMP process, a surface of a substrate is polished while a slurry is provided to a polishing pad and the substrate is pressed and rotated. A target to be planarized varies according to a stage of a process, and there is also a difference in physical properties of the slurry applied at this time.

Polysilicon is mainly used for a sacrificial layer in a final stage of a gate forming process in micro-electro mechanical systems (MEMS) or next-generation devices. Recently, in front end of line (FEOL) and MEMS cavity device processes of through silicon vias (TSVs), a layer having both thermal stability and mechanical stability has been required, and a layer in which polysilicon is doped with impurities at a high level has been used.

In a case of impurity doping, boron is used as a p-type dopant, and phosphorous is used as an n-type dopant. In particular, boron is mainly used as a dopant because it is known that phosphorus suppresses a deposition rate in a chemical vapor deposition (CVD) method.

In a case of a boron-doped polysilicon layer (BDPSi) in which boron is used as the dopant, the physical strength thereof increases as a content of boron increases, and thus there is a problem that a polishing rate is relatively very low when the CMP process is performed.

Conventionally, in order to improve a polishing rate of a boron-doped layer, an additive containing an amine group has been used in the slurry. However, when an amine compound is added to the slurry in the form of the additive as described above, a chemical reaction occurs partially on a wafer, such that there is a problem that a defect and a variation in the polishing rate occur on the wafer.

There is a need to develop a polishing composition for a semiconductor process capable of improving the polishing rate of the boron-doped layer and preventing the defect and the variation in polishing rate on the wafer as described above.

DISCLOSURE

Technical Problem

An object of the present disclosure is to provide a polishing composition for a semiconductor process and a method for polishing a substrate by using the same.

Another object of the present disclosure is to provide a polishing composition for a semiconductor process capable of increasing a polishing rate of a boron-doped layer and improving a polishing selectivity, and a method for polishing a substrate by using the same.

Still another object of the present disclosure is to provide a polishing composition for a semiconductor process capable of preventing a defect of a wafer that may occur in a polishing process and improving surface roughness of the wafer, and a method for polishing a substrate by using the same.

Yet another object of the present disclosure is to provide a method for manufacturing a semiconductor device by using a polishing composition for a semiconductor process.

Technical Solution

In order to achieve the above object, an embodiment of the present disclosure provides a polishing composition for a semiconductor process including: water; and a polishing particle, wherein the polishing particle includes a functional group bonded to a surface of the polishing particle, the functional group includes an amine group, and a polishing selectivity of a silicon nitride layer to a boron-doped polysilicon layer is 1:100 to 1:600.

Another embodiment of the present disclosure provides a polishing composition for a semiconductor process including: water; a polishing particle surface-treated with a functional group including an amine group; and an amine-based agent for improving a polishing rate, wherein an etch rate for a boron-doped polysilicon layer is 2,000 Å/min or more.

Still another embodiment of the present disclosure provides a method for manufacturing a semiconductor device including: providing a semiconductor substrate including a boron-doped polysilicon layer and a silicon nitride layer; and polishing the boron-doped polysilicon layer and the silicon nitride layer using a polishing composition, wherein the polishing composition includes: water; and a polishing particle, the polishing particle includes a functional group bonded to a surface of the polishing particle, the functional group includes an amine group, and a polishing selectivity of the silicon nitride layer to the boron-doped polysilicon layer is 1:100 to 1:600.

Advantageous Effects

The present disclosure may increase a polishing rate of a boron-doped layer, improve a polishing selectivity, prevent a defect of a wafer that may occur during the polishing process, and improve surface roughness of the wafer.

In addition, a polished semiconductor substrate may be manufactured by using a polishing composition for a semiconductor process.

BEST MODE

Hereinafter, embodiments of the present disclosure will be described in detail so as to be easily carried out by those of ordinary skill in the art to which the present disclosure pertains. However, the present disclosure may be implemented in various different forms and is not limited to examples described herein.

As used herein, when any component is referred to as "including" another component, it means the further inclusion of other components rather than the exclusion of other components, unless explicitly described to the contrary.

As used herein, when any component is referred to as being "connected to" another component, it means that both components are "directly connected to" each other or are "connected to" each other with another component interposed therebetween.

As used herein, "B is located on A" means that B is located directly on A or B is located on A while another layer is located therebetween and is not construed as being limited to B located in contact with the surface of A.

As used herein, the term "combinations thereof" included in the expression of a Markush-type refers to one or more mixtures or combinations selected from the group consisting of the components described in the expression of the Markush-type, which include one or more selected from the group consisting of the above components.

As used herein, the description of "A and/or B" means "A, B, or A and B."

As used herein, terms such as "first" and "second" or "A" and "B" are used to distinguish the same terms from each other unless otherwise specified.

As used herein, the singular expression is to be construed as meaning including the singular or the plural as interpreted in context unless otherwise specified.

As used herein, "hydrogen" is hydrogen, protium, deuterium, or tritium.

As used herein, "alkyl" refers to a monovalent substituent derived from a straight or branched chain, saturated hydrocarbon having 1 to 40 carbon atoms. Examples of the alkyl may include, but are not limited to, methyl, ethyl, propyl, isobutyl, sec-butyl, pentyl, iso-amyl, hexyl, etc.

As used herein, "alkenyl" refers to a monovalent substituent derived from a straight or branched chain, unsaturated hydrocarbon having 2 to 40 carbon atoms and having one or more carbon-carbon double bonds. Examples of the alkenyl may include, but are not limited to, vinyl, allyl, isopropenyl, 2-butenyl, etc.

As used herein, "alkynyl" refers to a monovalent substituent derived from a straight or branched chain, unsaturated hydrocarbon having 2 to 40 carbon atoms and having one or more carbon-carbon triple bonds. Examples of the alkynyl may include, but are not limited to, ethynyl, 2-propynyl, etc.

As used herein, "cycloalkyl" refers to a monovalent substituent derived from a monocyclic or polycyclic non-aromatic hydrocarbon having 3 to 40 carbon atoms. Examples of the cycloalkyl may include, but are not limited to, cyclopropyl, cyclobutyl, cyclopentyl, cyclohexyl, norbornyl, adamantine, etc.

Hereinafter, the present disclosure will be described in detail.

A polishing composition for a semiconductor process according to an embodiment of the present disclosure includes: water; and a polishing particle, wherein the polishing particle includes a functional group bonded to a surface of the polishing particle, the functional group includes an amine group, and a polishing selectivity of a silicon nitride layer to a boron-doped polysilicon layer is 1:100 to 1:600.

The polishing particle is a metal oxide particle that may be applied to the polishing composition for a semiconductor process, and may be, for example, selected from the group consisting of colloidal silica, fumed silica, ceria, alumina, titania, zirconia, and mixtures thereof, but the present disclosure is not limited thereto, and any metal oxide particle selectable by those skilled in the art may be used as the polishing particle without limitation.

The polishing particle according to the present disclosure may be specifically selected from the group consisting of colloidal silica, fumed silica, ceria, and a mixture thereof.

The polishing particle may be included in an amount of 5 wt % to 15 wt %, and preferably 7 wt % to 12 wt %, based on the total weight of the polishing composition for a semiconductor process. When the polishing particle is included in the above content range, it is possible to obtain the effect of reducing instability and defects on the surface of the polished substrate at the same time.

The polishing particle of the present disclosure includes the functional group bonded to the surface of the polishing particle, and the functional group includes a terminal amine group.

The polishing particle includes the functional group bonded to the surface of the polishing particle, and the functional group includes the amine group, and more specifically, the terminal amine group.

In a case of a boron-doped polysilicon layer (BDPSi) in which boron is used as a dopant, the physical strength thereof increases as a content of boron increases, and thus there is a problem that a polishing rate is relatively very low when a CMP process is performed. In order to solve such a problem, an additive containing an amine group has been conventionally used in a polishing composition. However, when an amine compound is added in the form of the additive as described above, a chemical reaction occurs partially on a wafer, such that a defect and a variation in the polishing rate may occur on the wafer.

In the boron-doped polysilicon layer (BDPSi) in which boron is used as the dopant, boron in group 13 is added as impurities, and in this case, an amount of added boron may be $10^{15}$ to $10^{19}$ per cm$^3$.

Accordingly, in the present disclosure, in order to prevent the defect and the variation in the polishing rate that may occur during a polishing process of the wafer by including the amine compound as the additive, the functional group may be bonded to the surface of the metal oxide particle, and the functional group may include the terminal amine group.

The content of the amine group is 0.0185 wt % to 0.05 wt %, based on the total weight of the polishing composition. When the amine group is bonded to the surface of the polishing particle within the above range, a polishing rate of the BDPSi may be increased, a polishing selectivity may be improved, a defect of the wafer due to the polishing process may be prevented, and surface roughness of the wafer may be improved. That is, when the amine group is included in an amount less than the above range, the effect described above may be insufficient, and when the amine group is included in an amount exceeding the above range, as in a case where the amine group is included in the form of the additive, a partial chemical reaction with the wafer may occur, such that a defect may occur and a variation in polishing rate may appear on the wafer during the polishing process.

Specifically, in a case of the colloidal silica, silane compounds are generally used in order to modify the surface of the particle. Among these silanes, in a case of silane substituted with an amine group, a high level of negative charges may be substituted with a predetermined level of positive charges. When a modified amine group and a boron-doped polysilicon surface come into contact with a silica surface, corrosion of a doped polysilicon surface may be accelerated by catalysis. In addition, a silica particle may adjust the surface roughness of a boron-doped silicon wafer to a very low level (less than 20 Å) while physically performing a polishing action.

It is possible to react with an amino silane compound to modify a surface of the colloidal silica to increase a polishing rate of the doped polysilicon, prevent the occurrence of the defect on the surface of the wafer, and maintain low roughness on the surface of the boron-doped silicon wafer.

If amino silane is bonded to the particle surface of the colloidal silica, it may be bonded as functional group as follow:

[Formula 1]

wherein

* means a portion boned to the surface of the metal oxide particles, $R_1$ and $R_2$ are the same as or different from each other, and are each independently selected from the group consisting of hydrogen, a substituted or unsubstituted alkyl group having 1 to 10 carbon atoms, a substituted or unsubstituted cycloalkyl group having 3 to 10 carbon atoms, a substituted or unsubstituted alkenyl group having 2 to 10 carbon atoms, and a substituted or unsubstituted alkynyl group having 2 to 10 carbon atoms, and $L_1$ is selected from the group consisting of a substituted or unsubstituted alkylene group having 1 to 10 carbon atoms, a substituted or unsubstituted alkenylene group having 2 to 10 carbon atoms, a substituted or unsubstituted alkynylene group having 2 to 10 carbon atoms, and a substituted or unsubstituted cycloalkylene group having 3 to 10 carbon atoms.

Specifically, $R_1$ and $R_2$ are the same as or different from each other, and may be each independently an alkyl group having 1 to 10 carbon atoms, and $L_1$ may be a substituted or unsubstituted alkylene group having 1 to 10 carbon atoms.

The amino silane may be, for example, any one selected from the group consisting of 3-aminopropyltriethoxysilane, bis[3-triethoxysilyl)propyl]amine, 3-aminopropyltrimethoxysilane, bis[3-trimethoxysilyepropyl]amine, 3-aminopropylmethyldiethoxysilane, 3-aminopropylmethyldimethoxysilane, N-[3-(trimethoxysilyl)propyl]ethylenediamine, N-bis[3-(trimethoxysilyepropyl]-1,2-ethylenediamine, N-[3-(triethoxysilyl)propyl]ethylenediamine, diethylenetriaminopropyltrimethoxysilane, diethylenetriaminopropylmethyldimethoxysilane, diethylaminomethyltriethoxysilane, diethylaminopropyltrimethoxysilane, diethylaminopropyltriethoxysilane, dimethylaminopropyltrimethoxysilane, N-[3-(trimethoxysilyl)propyl]butylamine, and combinations thereof.

Specifically, the amino silane used for surface modification of colloidal silica may be aminopropyltriethoxysilane, but the present disclosure is not limited to the above examples, and amino silane capable of preventing the polishing rate and surface defects of boron-doped silicon wafers may be used without limitation.

The amino silane compound may be included in an amount of 0.15 wt % to 0.3 wt %, preferably 0.15 wt % to 0.25 wt %, based on the total weight of the polishing composition for a semiconductor process. When the amino silane compound is included within the above range, a sufficient polishing rate for BDPSi may be exhibited by bonding an amine group to the surface of the polishing particle. When the amino silane compound is included in an amount exceeding the above range, the polishing rate for BDPSi may be increased, but the polishing particle and unreacted amino silane compound may remain due to excessive addition, and the remaining amino silane compound may be adsorbed on the surface of the wafer, resulting in a defect.

In addition, in order for a physically surface-modified colloidal silica particle to adjust the roughness of the surface of BDPSi to a very low level of less than 20 Å while physically performing a polishing action, during a catalytic action between the surface of the polishing particle and a target film, the extent or size of the catalytic reaction needs to be increased depending on the roughness of the target film.

In this case, the catalytic reaction on the modified surface of the particles may not be sufficient to control the roughness of the entire area of the wafer. That is, it cannot exhibit a very low level of surface roughness as in the present disclosure. In order to solve this, an additional additive is required in addition to the modified surface of the particles when the slurry is prepared.

In another embodiment of the present disclosure, a polishing composition for a semiconductor process includes: water; a polishing particle surface-treated with a functional group including an amine group; and an amine-based agent for improving a polishing rate, wherein the etch rate to the boron-doped polysilicon layer is 2,000 Å/min or more.

The additive included in order to exhibit a very low level of surface roughness as described above is specifically an amine-based agent for improving a polishing rate.

Specifically, based on the total weight of the composition, the content of the amine group included in the functional group bonded to the surface of the polishing particles is 0.008 wt % to 0.06 wt %, and the content of the amine group included in the agent for improving a polishing rate is 0.006 wt % to 0.05 wt %. The amine group, which is a functional group bonded to the surface of the polishing particles, has a slightly lower content range as the agent for improving a polishing rate is additionally included based on the total weight of the composition. When the amine group is included within the above range, a polishing rate of the BDPSi may be increased, a polishing selectivity may be improved, a defect of the wafer due to the polishing process may be prevented, and surface roughness of the wafer may be improved.

The agent for improving a polishing rate may be more specifically selected from the group consisting of glycine, β-alanine betaine, stearyl betaine, and a mixture thereof, and preferably glycine, but the present disclosure is not limited to the examples.

The agent for improving a polishing rate may be included in the polishing composition together with the surface-modified polishing particle to increase the polishing rate for BDPSi, and exhibit a very low level of surface roughness.

The agent for improving a polishing rate may be included in an amount of 0.03 wt % to 0.095 wt %, preferably 0.05 wt % to 0.08 wt %, based on the total weight of the polishing composition for a semiconductor process. When the agent for improving a polishing rate is mixed within the above range, it is possible to not only exhibit a high etch rate for BDPSi but also to control the polishing selectivity with the silicon nitride layer.

The polishing composition may have an etch rate for BDPSi of 2,000 Å/min or more, and an etch rate for the silicon nitride layer of 100 Å/min or less.

Specifically, the polishing composition of the present disclosure may have an etch rate for BDPSi of 2,000 Å/min or more, and preferably 2,100 Å/min or more, thereby exhibiting an excellent etch rate, and a low etch rate for a silicon nitride layer.

The polishing composition for a semiconductor process according to the present disclosure is characterized in that the polishing selectivity of the silicon nitride layer (SiN) to the polysilicon layer is 1:50 to 1:600, preferably 1:50 to 1:200, and more preferably 1:50 to 1:100. Specifically, the polysilicon layer is BDPSi, and BDPSi as described above has a problem in that the physical strength thereof is increased due to boron doping, so that the polishing rate is relatively low during the polishing process.

By improving such a problem, it is necessary to increase the polishing rate for BDPSi, and exhibit a low polishing rate for the silicon nitride layer as a polishing stopper layer. In order to exhibit the polishing selectivity of the polishing composition of the present disclosure, a semiconductor substrate is a wafer with a diameter of 300 mm having a thickness of the silicon nitride (SiN) of 1,500 Å by depositing SiN on a bare silicon wafer.

Specifically, the BDPSi is polished by using the silicon nitride layer as the polishing stopper layer. If the polishing selectivity is not adjusted as described above, process defects such as dishing and erosion may occur. Therefore, as in the present disclosure, a high-quality polished surface may be provided by adjusting the polishing selectivity of the silicon nitride layer (SiN) to the BDPSi to minimize process defects.

In order to suppress the polishing of the silicon nitride layer, the polishing composition according to the present disclosure includes a polishing inhibitor, wherein the polishing inhibitor may be selected from the group consisting of polyacrylic acid, polyphosphoric acid, polymaleic acid, polymethacrylic acid, polyacrylamide-co-acrylic acid, polyacrylic acid-co-maleic acid, polyacrylamide-co-acrylic acid, and a mixture thereof, and is preferably polyacrylic acid, but the present disclosure is not limited to the examples, and any composition that can be used as a polishing inhibitor by a person skilled in the art may be used without limitation.

The polishing inhibitor is included in an amount of 0.05 wt % to 0.1 wt %, preferably 0.06 wt % to 0.09 wt %, based on the total weight of the polishing composition for a semiconductor process. When the polishing inhibitor is mixed within the above range, the polishing selectivity of the silicon nitride layer for the BDPSi may be adjusted by suppressing polishing of the silicon nitride layer.

The polishing composition may further include a surfactant. The surfactant may be a nonionic surfactant.

The non-ionic surfactant may be selected from the group consisting of polyethylene glycol, polypropylene glycol, polyethylene-propylene copolymer, polyalkyl oxide, polyoxyethylene oxide (PEO), polyethylene oxide, and polypropylene oxide; and a fluorine-based surfactant may be selected from the group consisting of a sodium sulfonate fluorosurfactant, a phosphate ester fluorosurfactant, an amine oxide fluorosurfactant, a betaine fluorosurfactant, an ammonium carboxylate fluorosurfactant, a stearate ester fluorosurfactant, a quaternary ammonium fluorosurfactant, an ethylene oxide/propylene oxide fluorosurfactant, and a polyoxyethylene fluorosurfactant.

The surfactant may be included in an amount of 0.0015 wt % to 0.005 wt %, preferably 0.0015 wt % to 0.003 wt %, based on the total weight of the polishing composition for a semiconductor process. When the surfactant is mixed within the above range, the occurrence of defects on the wafer surface by the polishing process may be suppressed.

The polishing composition of the present disclosure may include a pH adjusting agent, and the pH adjusting agent may be any one selected from the group consisting of hydrochloric acid, phosphoric acid, sulfuric acid, hydrofluoric acid, hydrobromic acid, iodic acid, formic acid, malonic acid, maleic acid, oxalic acid, acetic acid, adipic acid, citric acid, adipic acid, acetic acid, propionic acid, fumaric acid, lactic acid, salicylic acid, pimeline, benzoic acid, succinic acid, phthalic acid, butyric acid, glutaric acid, glutamic acid, glycolic acid, lactic acid, aspartic acid, tartaric acid, and potassium hydroxide.

The pH adjusting agent may be included in an amount of 0.01 wt % to 0.05 wt %, based on the total weight of the polishing composition for a semiconductor process. The polishing composition for a semiconductor process may have a pH of 2 to 5, and preferably 2 to 3. When the acidic environment is maintained within the above range, excessive corrosion of metal components or polishing equipments may be prevented while maintaining the polishing rate and quality to a certain level or higher.

The polishing composition for a semiconductor process includes a solvent as a remaining component except for the components described above and additional components to be described later. The solvent may be water, preferably ultrapure water is applied. The solvent may be included in the content range of the remainder of the content ranges of a polishing particle, a surface modifier, an agent for improving a polishing rate, a pH adjusting agent, a surfactant, and a polishing inhibitor.

Figure 1:
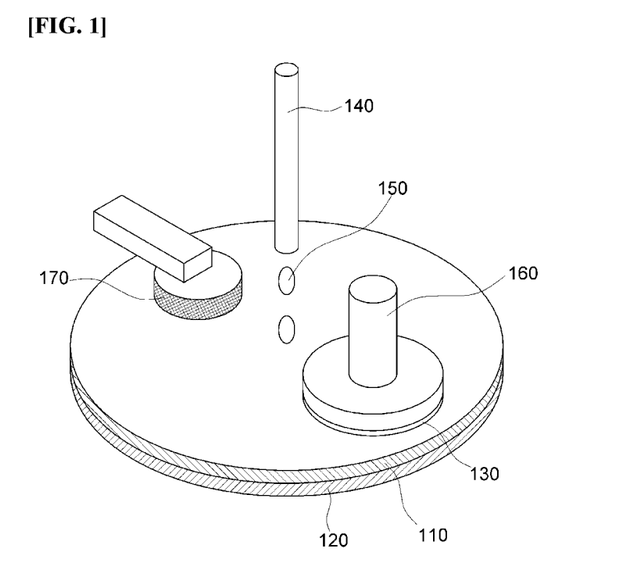
FIG. 1 is a schematic view illustrating a manufacturing process of a semiconductor device according to an embodiment of the present disclosure.

FIG. 1 is a schematic view illustrating a manufacturing process of a semiconductor device according to an embodiment. Referring to FIG. 1, after a polishing pad 110 according to the embodiment is mounted on a surface plate 120, a semiconductor substrate 130, which is a target to be polished, is disposed on the polishing pad 110. For polishing, a polishing slurry 150 is sprayed onto the polishing pad 110 through a nozzle 140.

A flow rate of the polishing slurry 150 supplied through the nozzle 140 may be selected according to a purpose in the range of about 10 cm$^3$/min to about 1,000 cm$^3$/min, and may be, for example, from about 50 cm$^3$/min to about 500 cm$^3$/min, but is not limited thereto.

A polished surface of the semiconductor substrate 130 is in direct contact with a polishing surface of the polishing pad 110.

Thereafter, the semiconductor substrate 130 and the polishing pad 110 are rotated relative to each other, such that the surface of the semiconductor substrate 130 may be polished. In this case, a rotation direction of the semiconductor substrate 130 and a rotation direction of the polishing pad 110 may be the same as or be opposite to each other. Each of rotation speeds of the semiconductor substrate 130 and the polishing pad 110 may be selected according to a purpose in the range of about 10 rpm to about 500 rpm, and may be, for example, about 30 rpm to about 200 rpm, but is not limited thereto.

As an example of the polishing process of the semiconductor substrate, when a substrate is polished in a case of a tungsten barrier metal layer CMP process, three layers including a tungsten layer (W) as well as a silicon oxide layer ($SiO_2$) and a titanium/titanium nitride layer used as a barrier metal layer may simultaneously appear. The polishing composition for a semiconductor process of the present disclosure may be applied to a polishing process for a substrate from which a boron-doped polysilicon layer appears.

A detailed description of the polishing composition for a semiconductor process overlaps with the above description, and thus the description thereof will be omitted.

In an embodiment, the method for manufacturing a semiconductor device includes: providing a semiconductor substrate 130 including a boron-doped polysilicon layer and a silicon nitride layer; and polishing the boron-doped polysilicon layer and the silicon nitride layer using a polishing composition. Here, the polishing composition includes water; and a polishing particle, wherein the polishing particle includes a functional group bonded to a surface of the polishing particle, the functional group includes an amine group, and a polishing selectivity of the silicon nitride layer to the boron-doped polysilicon layer is 1:100 to 1:600.

Figure 2:
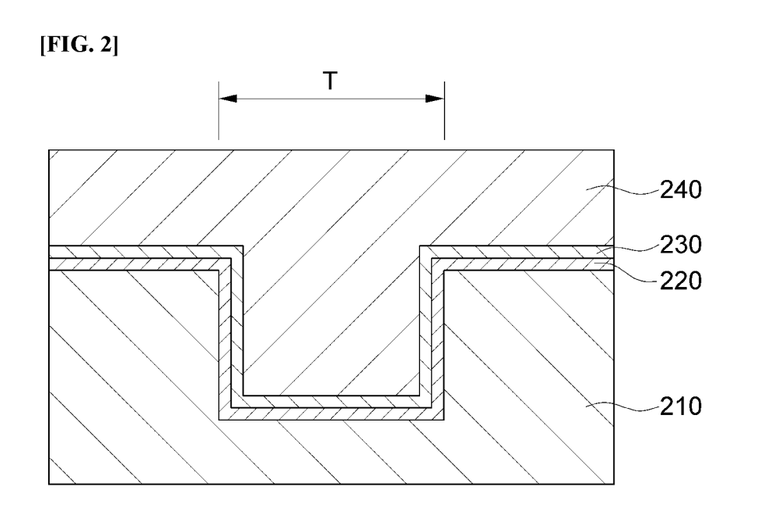
FIG. 2 is a cross-sectional view of a semiconductor substrate including a boron-doped polysilicon layer and a silicon nitride layer before a polishing process according to an embodiment of the present disclosure.
Figure 3:
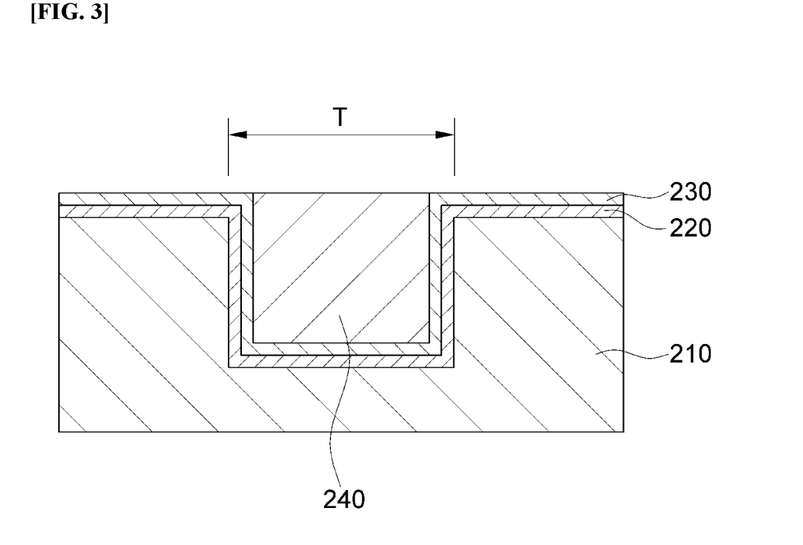
FIG. 3 is a cross-sectional view of the semiconductor substrate including the boron-doped polysilicon layer and the silicon nitride layer polished by using a polishing composition for a semiconductor process according to an embodiment of the present disclosure.

The method for manufacturing a semiconductor device may be confirmed in more detail with reference to FIGS. 2 and 3. FIG. 2 is a cross-sectional view of a semiconductor substrate including a boron-doped polysilicon layer and a silicon nitride layer before a polishing process. FIG. 3 is a cross-sectional view of the semiconductor substrate including the boron-doped polysilicon layer and the silicon nitride layer polished by using a polishing composition for a semiconductor process according to an embodiment of the present disclosure.

Referring to FIG. 2, in the semiconductor substrate, a trench having a vertical wall is formed, a silicon wafer 210, a silicon oxide layer 220, and a silicon nitride layer (SiN) 230 are stacked, and a boron-doped polysilicon layer (BDPSi) 240 is deposited. The semiconductor substrate of FIG. 2 is subjected to a polishing process using the polishing composition according to the present disclosure, and the boron-doped polysilicon layer (BDPSi) 240 is polished as shown in FIG. 3. The polishing composition according to the present disclosure exhibits a high polishing rate for the boron-doped polysilicon layer (BDPSi) 240, and a low polishing rate for the silicon nitride layer (SiN) 230, as a polishing stopper layer. Due to the above properties, when the semiconductor substrate is polished by using the polishing composition according to the present disclosure, the polishing process is completed when the silicon nitride layer (SiN) 230 is exposed. The method for manufacturing a semiconductor device uses the polishing composition according to the present disclosure to minimize process defects by adjusting the polishing selectivity of the silicon nitride layer (SiN) to the boron-doped polysilicon layer (BDPSi) 240 as shown in FIGS. 2 and 3, thereby providing a high-quality polished surface.

EXAMPLES

Preparation of Semiconductor Polishing Composition

Colloidal silica was used as the metal oxide particles. The colloidal silica was reacted with 3-aminopropyltriethoxysilane as a surface modifier to prepare an amino silane compound to be bonded to the surface thereof.

A semiconductor polishing composition was prepared by using ultrapure water as a solvent, glycine as an agent for improving a polishing rate, acetic acid and/or potassium hydroxide as a pH adjusting agent, polyethylene glycol and/or a fluorine-based surfactant as a surfactant, and poly acrylic acid as a polishing inhibitor.

The composition was prepared by mixing the components in the range shown in Table 1 below based on 90 parts by weight of the solvent.

TABLE 1

| | Metal oxide particle content | Surface modifier (Amine group content (wt %) | Agent for improving polishing rate (Amine group content (wt %) | PH adjusting agent | Surfactant | Polishing inhibitor | Particle size (nm) | pH | Viscosity (cP) |
|---|---|---|---|---|---|---|---|---|---|
| Example 1 | 10 | 0.2 (0.0145) | 0.05 (0.01067) | 0.02 | 0.002 | 0.08 | 44 | 2.4 | 1.32 |
| Example 2 | 10 | 0.2 (0.0145) | 0.075 (0.016) | 0.02 | 0.002 | 0.08 | 45 | 2.4 | 1.30 |
| Example 3 | 10 | 0.2 (0.0145) | 0.05 (0.01067) | 0.02 | 0.001 | 0.08 | 44 | 2.4 | 1.28 |
| Example 4 | 10 | 0.2 (0.0145) | 0.1 (0.02133) | 0.02 | 0.002 | 0.08 | 46 | 2.4 | 1.31 |
| Comp. Example 1 | 10 | 0.2 (0.0145) | 0.025 (0.005333) | 0.02 | 0.002 | 0.08 | 42 | 2.4 | 1.30 |
| Comp. Example 2 | 10 | 0.1 (0.00724) | 0.05 (0.01067) | 0.02 | 0.002 | 0.08 | 44 | 2.4 | 1.33 |
| Example 5 | 10 | 0.4 (0.0290) | 0.05 (0.01067) | 0.02 | 0.002 | 0.08 | 44 | 2.4 | 1.32 |

(unit: parts by weight)

Experimental Examples

Polishing Evaluation of Polishing Composition (1) Polishing Evaluation

A polishing evaluation was performed on a boron-doped polysilicon layer (average roughness Ra=16 Å immediately after deposition), wherein the wafer had a diameter of 300 mm and a thickness of about 6,000 Å. Specifically, an HD-319B pad (SKC) with a diameter of 30 inches and a thickness of 3T was used as a polishing pad. The polishing was performed under the conditions of a pressure of 3.0 psi, a carrier speed of 103 rpm, a platen speed of 97 rpm, and a slurry flow rate of 300 ml/min for 60 seconds, and at the same time, conditioned at a speed of 200 rpm and for 5 minutes with a pressure of 5 lb.

An additional polishing evaluation was performed on a silicon nitride layer having a thickness of about 1,500 Å under the same polishing conditions.

After the polishing process was performed, the thickness of each wafer was measured, and the polishing rate (polishing speed; Å/min) of the slurry composition was calculated therefrom.

(2) Defect Measurement

After polishing was performed under the same conditions as in the CMP evaluation, a cleaning process was performed under a chemical spraying condition of a brush rotation speed of 500 rpm and 60 s 2000 cc/min using a self-prepared cleaning chemical solution. The boron-doped polysilicon layer and undoped polysilicon layer, which has completely subjected the cleaning process, were sealed and total defects thereof were measured using an AIT-XP+ equipment owned by SKC.

(3) Roughness (Ra) Measurement

AFM measurement was performed using the 300 mm wafer on which defect measurement was completed. For AFM measurement conditions, an average value of Ra results measured 5 times in each of 0 mm, −75 mm, +75 mm, −150 mm, and +150 mm in the position (−150 mm to +150 mm) area of the 300 mm wafer was calculated.

The polishing evaluation results are shown in Table 2 below.

TABLE 2

| | Etch rate for boron-doped polysilicon layer (BDPSi, Å/min) | Defect of boron-doped polysilicon layer (ea) | Roughness of boron-doped polysilicon layer (Ra, Å) | Etch rate for silicon nitride layer (SiN, Å/min) | Polishing selectivity (BDPSi/SiN) |
|---|---|---|---|---|---|
| Example 1 | 2629 | 62 | 0.6 | 23 | 114 |
| Example 2 | 2944 | 77 | 0.7 | 28 | 105 |
| Example 3 | 2543 | 423 | 12.3 | 24 | 105 |
| Example 4 | 3221 | 61 | 14.2 | 65 | 49 |
| Comp. Example 1 | 984 | 66 | 0.7 | 47 | 21 |
| Comp. Example 2 | 355 | 64 | 0.5 | 35 | 10 |
| Example 5 | 2140 | 224 | 5.1 | 113 | 19 |

According to Table 2, Examples 1 and 2 of the present disclosure showed excellent etch rates for the boron-doped polysilicon layer, and exhibited excellent effects on defects and roughness on the wafer after the polishing process. In addition, an optimal polishing selectivity of the silicon nitride layer to the boron-doped polysilicon layer may be obtained by suppressing an etch rate for the silicon nitride layer.

On the other hand, Example 3 had excessive defects after the polishing process, and Example 4 showed a high etch rate for the boron-doped polysilicon layer, but a high etch rate for the silicon nitride layer and a low polishing selectivity of the silicon nitride layer to the boron-doped polysilicon layer.

It was confirmed that Comparative Examples 1 and 2 exhibited low etch rates for boron-doped polysilicon layers, and Example 5 showed excellent etch rate for the boron-doped polysilicon layer, but had excessive defects and a high roughness value.

Although preferred embodiments of the present disclosure have been described in detail hereinabove, the scope of the present disclosure is not limited thereto, but may also include several modifications and alterations made by those skilled in the art using a basic concept of the present disclosure as defined in the claims.

The invention claimed is:
1. A polishing composition for a semiconductor process, comprising:
   water; and
   a polishing particle,
   wherein the polishing particle includes a functional group bonded to a surface of the polishing particle,
   the functional group includes an amine group, and
   a polishing selectivity of a silicon nitride layer to a boron-doped polysilicon layer is 1:100 to 1:600,
   wherein the content of the amine group is 0.0185 wt % to 0.05 wt %, based on the total weight of the polishing composition.

2. The polishing composition of claim 1, having a pH of 2 to 5.

3. The polishing composition of claim 1, having an etch rate for the silicon nitride layer of 100 Å/min or less.

4. The polishing composition of claim 1, wherein the functional group bonded to the surface of the polishing particle includes the following structure of Formula 1:

[Formula 1]

wherein
means a portion bonded to the surface of the polishing particle,
$R_1$ and $R_2$ are the same as or different from each other, and are each independently selected from the group consisting of hydrogen, a substituted or unsubstituted alkyl group having 1 to 10 carbon atoms, a substituted or unsubstituted cycloalkyl group having 3 to 10 carbon atoms, a substituted or unsubstituted alkenyl group having 2 to 10 carbon atoms, and a substituted or unsubstituted alkynyl group having 2 to 10 carbon atoms, and
$L_1$ is selected from the group consisting of a substituted or unsubstituted alkylene group having 1 to 10 carbon atoms, a substituted or unsubstituted alkenylene group having 2 to 10 carbon atoms, a substituted or unsubstituted alkynylene group having 2 to 10 carbon atoms, and a substituted or unsubstituted cycloalkylene group having 3 to 10 carbon atoms.

5. The polishing composition of claim 4, wherein $R_1$ and $R_2$ are the same as or different from each other, and are each independently an alkyl group having 1 to 10 carbon atoms.

6. The polishing composition of claim 4, wherein $L_1$ is a substituted or unsubstituted alkylene group having 1 to 10 carbon atoms.

7. The polishing composition of claim 1, further comprising an agent for improving a polishing rate containing an amine group, wherein the content of the amine group included in the functional group bonded to the surface of the polishing particle is 0.008 wt % to 0.06 wt %, based on the total weight of the polishing composition, and the content of the amine group included in the agent for improving a polishing rate is 0.006 wt % to 0.05 wt %, based on the total weight of the polishing composition.

8. The polishing composition of claim 7, further comprising a polishing inhibitor for the silicon nitride layer.

9. The polishing composition of claim 8, wherein the polishing inhibitor for the silicon nitride layer is selected from the group consisting of polyacrylic acid, polyphosphoric acid, polymaleic acid, polymethacrylic acid, polyacrylamide-co-acrylic acid, polyacrylic acid-co-maleic acid, polyacrylamide-co-acrylic acid, and a mixture thereof.

10. The polishing composition of claim 1, further comprising a surfactant.

11. The polishing composition of claim 10, wherein the surfactant is selected from the group consisting of polyethylene glycol, polypropylene glycol, polyethylene-propylene copolymer, polyalkyl oxide, polyoxyethylene oxide (PEO), polyethylene oxide, polypropylene oxide; a sodium sulfonate fluorosurfactant, a phosphate ester fluorosurfactant, an amine oxide fluorosurfactant, a betaine fluorosurfactant, an ammonium carboxylate fluorosurfactant, a stearate ester fluorosurfactant, a quaternary ammonium fluorosurfactant, an ethylene oxide/propylene oxide fluorosurfactant, and a polyoxyethylene fluorosurfactant.

12. The polishing composition of claim 10, wherein the surfactant is included in an amount of 0.0015 wt % to 0.005 wt %, based on the total weight of the polishing composition.

13. The polishing composition of claim 1, further comprising a pH adjusting agent.

14. The polishing composition of claim 13, wherein the pH adjusting agent is selected from the group consisting of hydrochloric acid, phosphoric acid, sulfuric acid, hydrofluoric acid, hydrobromic acid, iodic acid, formic acid, malonic acid, maleic acid, oxalic acid, acetic acid, adipic acid, citric acid, adipic acid, acetic acid, propionic acid, fumaric acid, lactic acid, salicylic acid, pimeline, benzoic acid, succinic acid, phthalic acid, butyric acid, glutaric acid, glutamic acid, glycolic acid, aspartic acid, tartaric acid, and potassium hydroxide.

15. A polishing composition for a semiconductor process, comprising:
water;
a polishing particle surface-treated with a functional group including an amine group; and
an amine-based agent for improving a polishing rate,
wherein an etch rate for a boron-doped polysilicon layer is 2,000 Å/min or more,
wherein the content of the amine group is 0.0185 wt % to 0.05 wt %, based on the total weight of the polishing composition.

16. The polishing composition of claim 15, wherein the amine-based agent for improving a polishing rate is selected from the group consisting of glycine, β-alanine betaine, stearyl betaine, and a mixture thereof.

17. The polishing composition of claim 15, wherein the amine-based agent for improving a polishing rate is included in an amount of 0.03 wt % to 0.095 wt %, based on the total weight of the polishing composition.

18. A method for manufacturing a semiconductor device, comprising:
providing a semiconductor substrate including a boron-doped polysilicon layer and a silicon nitride layer; and
polishing the boron-doped polysilicon layer and the silicon nitride layer using a polishing composition,
wherein the polishing composition includes water; and
a polishing particle,
the polishing particle includes a functional group bonded to a surface of the polishing particle,
the functional group includes an amine group, and
a polishing selectivity of the silicon nitride layer to the boron-doped polysilicon layer is 1:100 to 1:600
wherein the content of the amine group is 0.0185 wt % to 0.05 wt %, based on the total weight of the polishing composition.

19. The method of claim 18, wherein the silicon nitride layer is a polishing stopper layer.

* * * * *